United States Patent [19]

Huber et al.

[11] Patent Number: 5,121,057

[45] Date of Patent: Jun. 9, 1992

[54] MEDIA FLAW DETECTION APPARATUS FOR A MAGNETIC DISK DRIVE WITH SQUARING AND SUMMING OF IN-PHASE AND QUADRATURE-PHASE DETECTED SIGNALS

[75] Inventors: William D. Huber, San Jose; Rod J. Swanson, Sunnyvale; Dennis C. Stark, Los Gatos, all of Calif.; Nicholas Bucska, Louisville, Colo.

[73] Assignee: Maxtor Corporation, San Jose, Calif.

[21] Appl. No.: 631,894

[22] Filed: Dec. 21, 1990

[51] Int. Cl.⁵ .................. G01R 33/12; G01N 27/82; G11B 27/36
[52] U.S. Cl. .................. 324/212; 328/120; 328/166; 329/358; 360/25
[58] Field of Search .................. 324/210, 212; 360/25, 360/31, 38.1, 45; 369/53, 58; 371/16.5, 21.1, 21.2; 328/120, 155, 166, 167; 329/304, 306–308, 346, 356, 358, 359, 363

[56] References Cited

U.S. PATENT DOCUMENTS

| | | | |
|---|---|---|---|
| 3,492,591 | 1/1970 | Shapiro | 328/166 X |
| 3,792,364 | 2/1974 | Ananias | 329/356 |
| 4,359,692 | 11/1982 | Ryan | 329/306 X |
| 4,394,626 | 7/1983 | Kurahara et al. | 328/155 X |
| 4,517,680 | 5/1985 | Betts et al. | 328/166 X |
| 4,754,222 | 6/1988 | Felleisen et al. | 324/212 |
| 4,881,136 | 11/1989 | Shiraishi et al. | 324/212 X |
| 4,881,246 | 11/1989 | Long | 329/304 X |
| 4,929,894 | 5/1990 | Monett | 324/212 |
| 4,959,619 | 9/1990 | Delacroix et al. | 329/306 |

OTHER PUBLICATIONS

Davenport and Root, "An Introduction to the Theory of Random Signals and Noise" McGraw-Hill, New York, 1958, pp. 265–267.

Bedrosian, S. D., "Normalized Design of 90 Phase-Difference Networks", IRE Transactions on Circuit Theory, Jun. 1960, pp. 128–136.

*Primary Examiner*—Gerard R. Strecker
*Attorney, Agent, or Firm*—Blakely, Sokoloff, Taylor & Zafman

[57] ABSTRACT

A media flaw detection apparatus having a sensitivity which is independent of the location of the flaw relative to the written test signal. The apparatus is equally sensitive to missing or extra bit defects. According to the invention, in-phase and quadrature-phase signals are heterodyned against the analog playback input signal. The resulting signals are squared and summed to produce a signal analogous to the effect of the flaw.

21 Claims, 7 Drawing Sheets

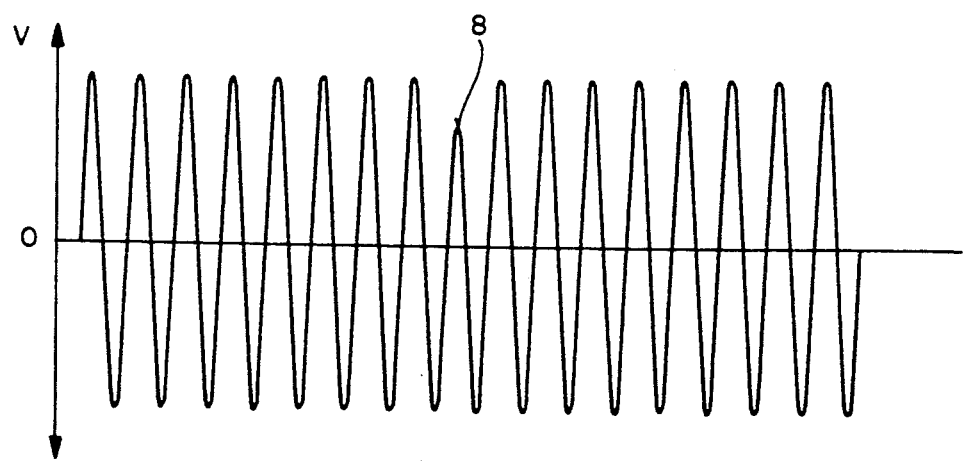
FIG_1A
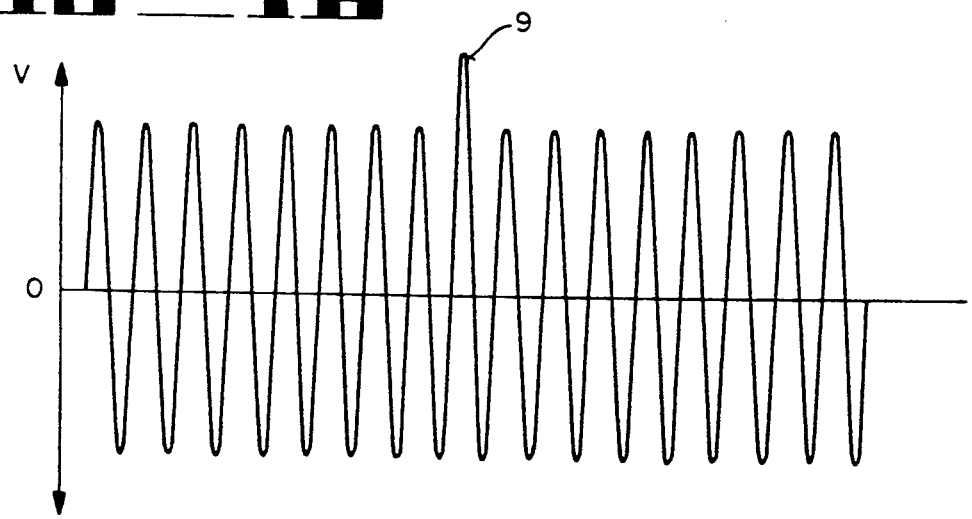
FIG_1B
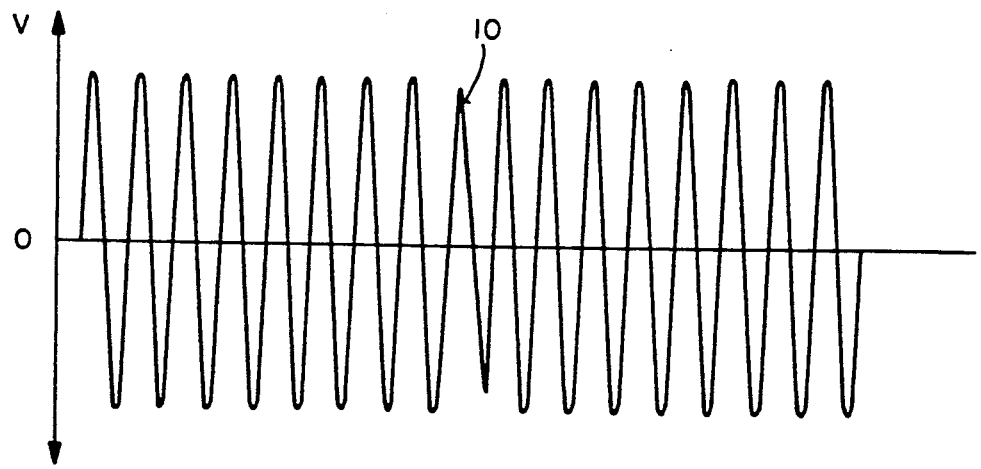
FIG_1C

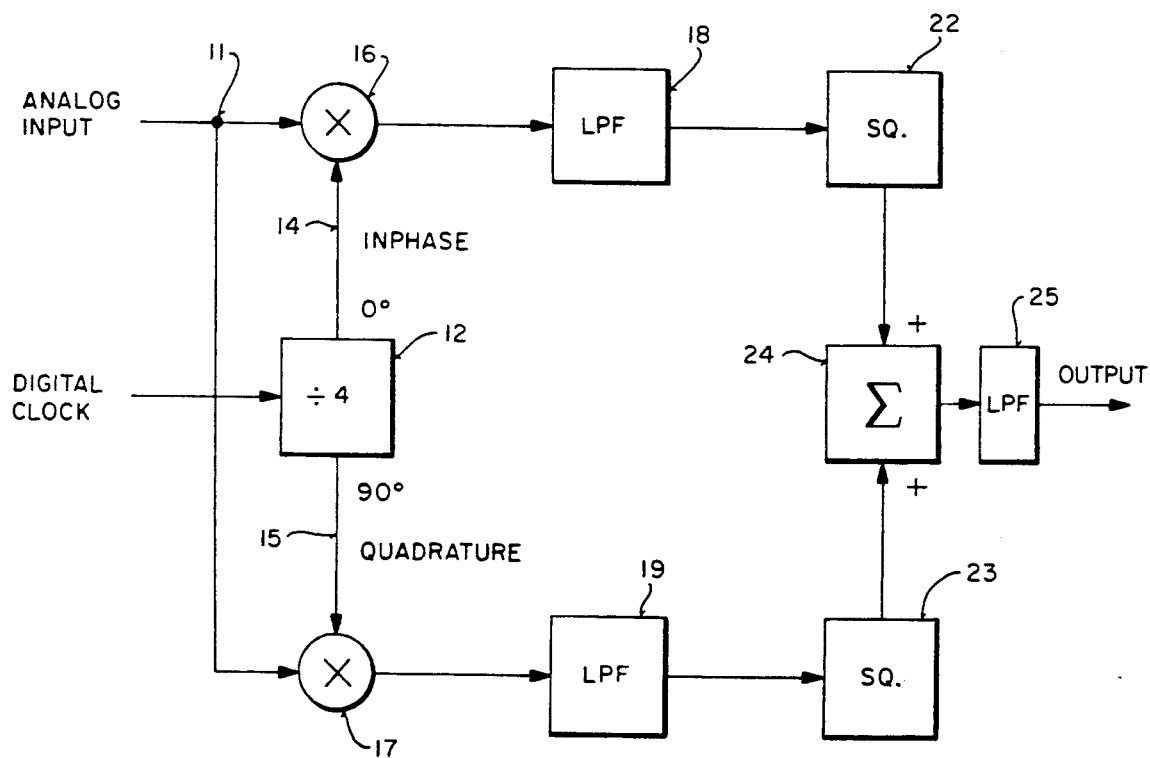
FIG_2

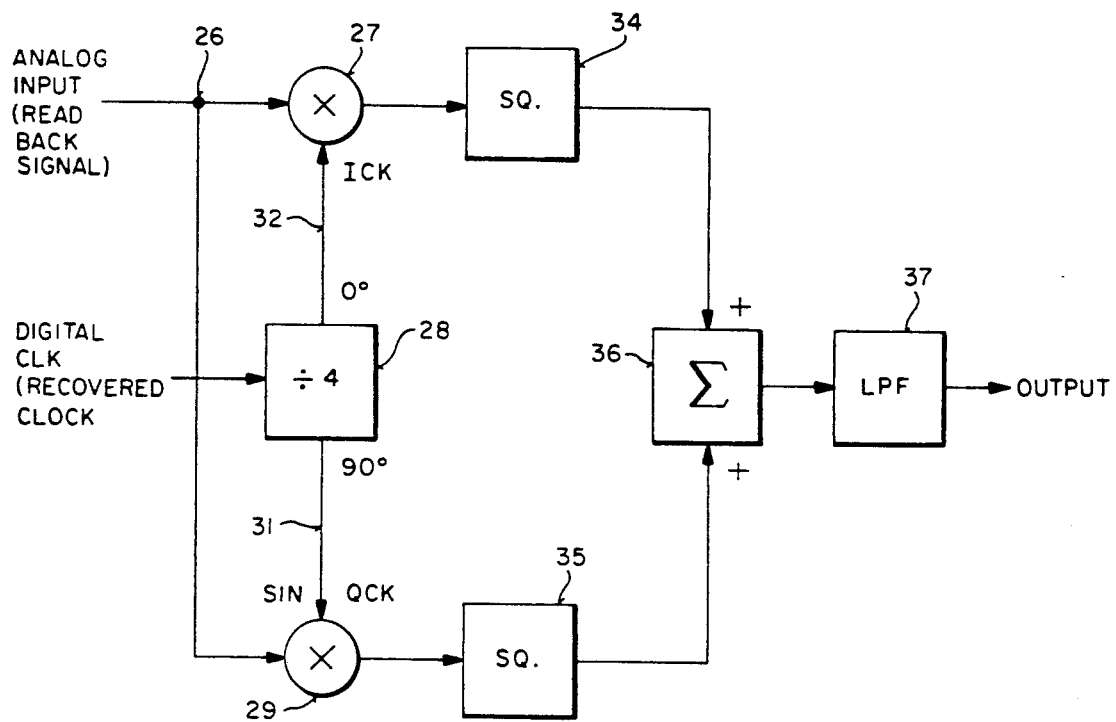
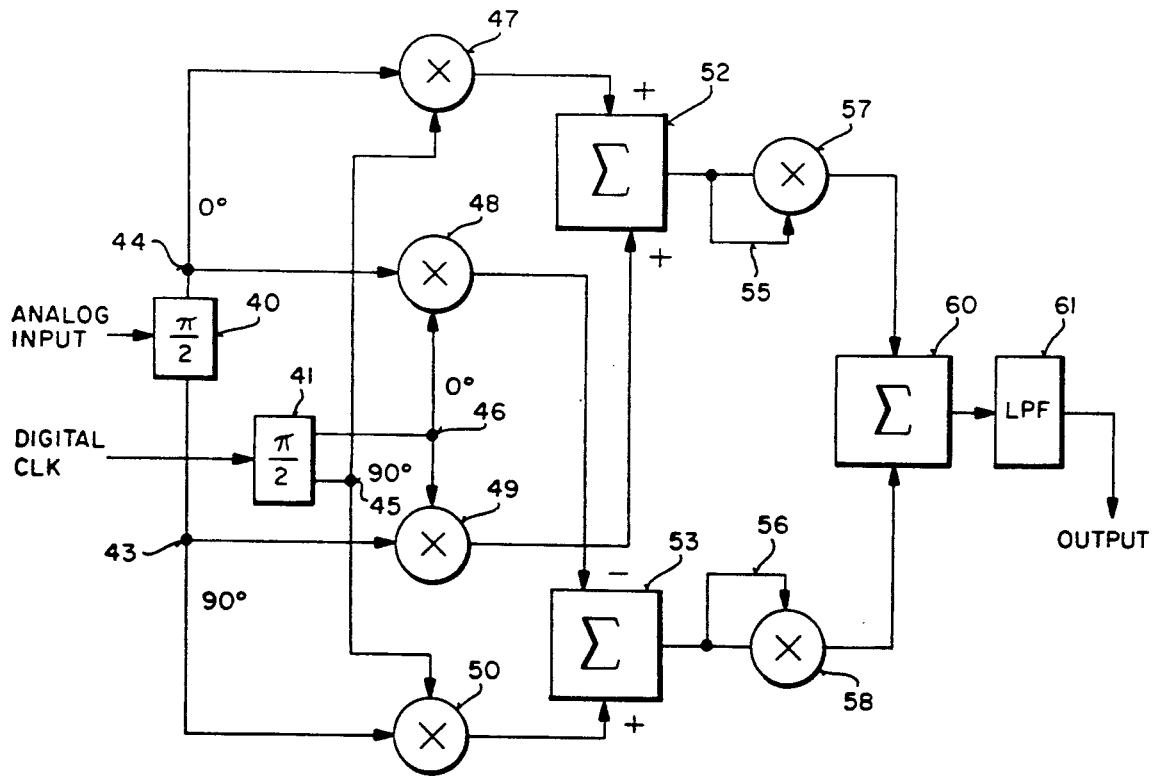

FIG_5
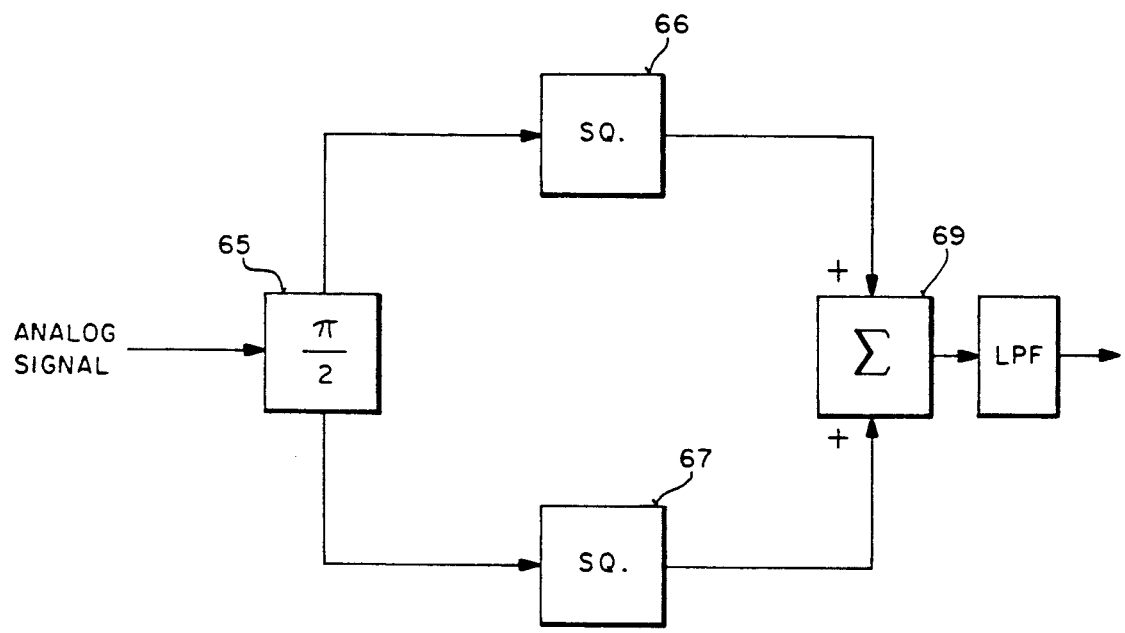
FIG_6
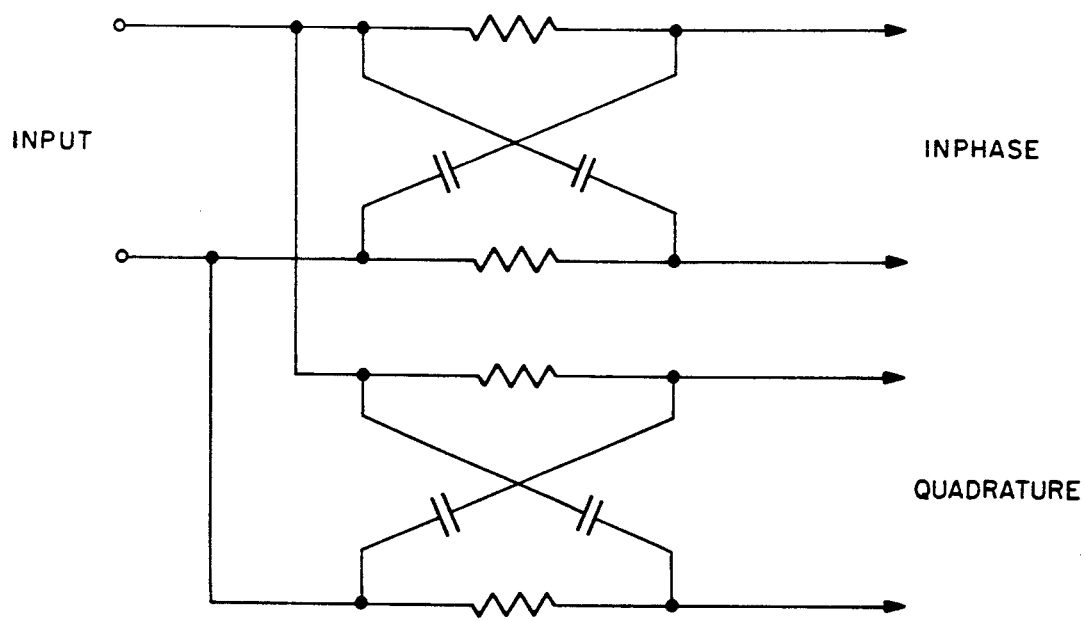

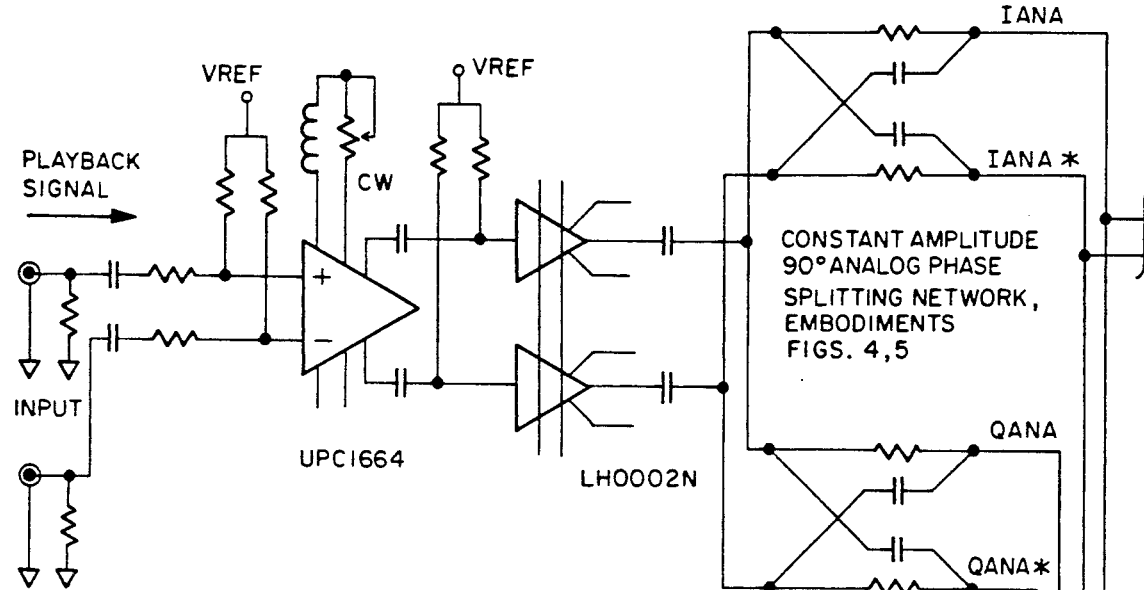
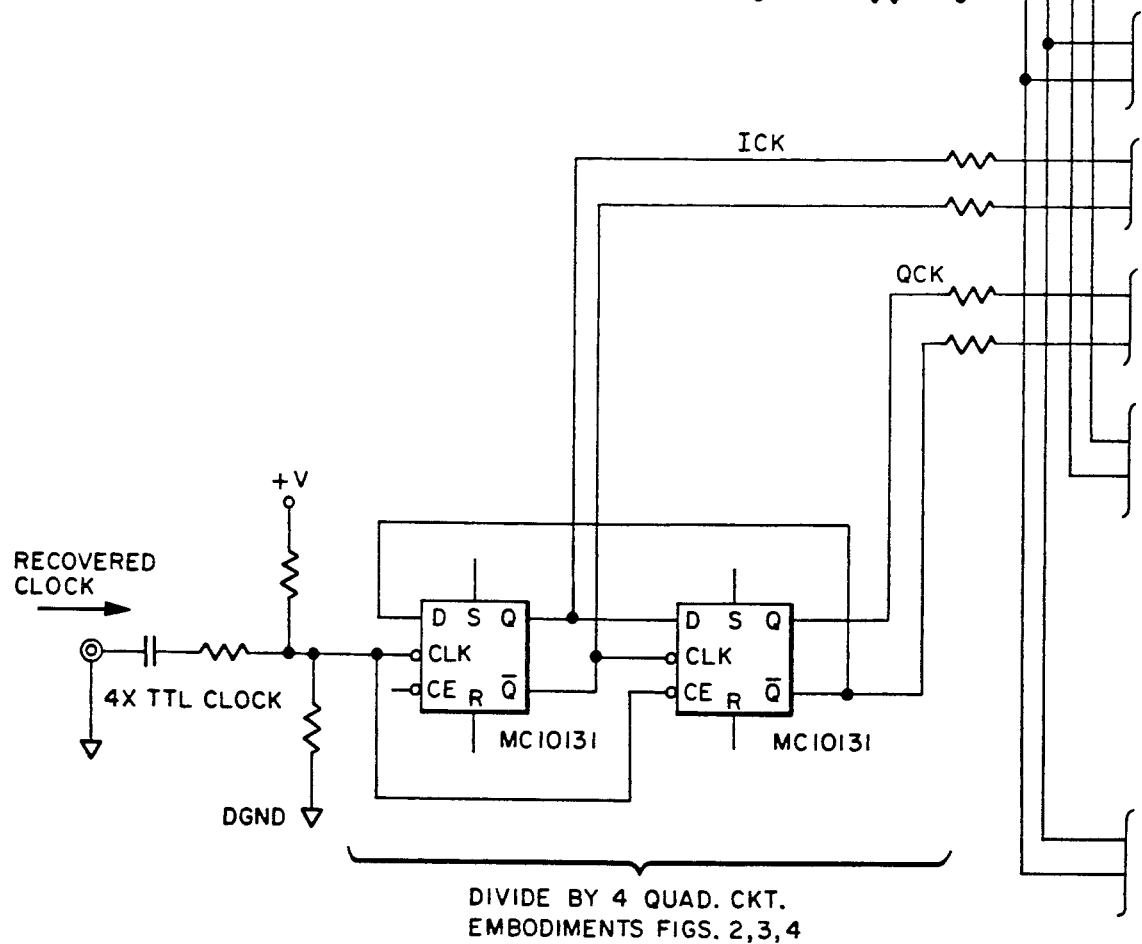
FIG_7A
FIG_7B →

FIG_7B

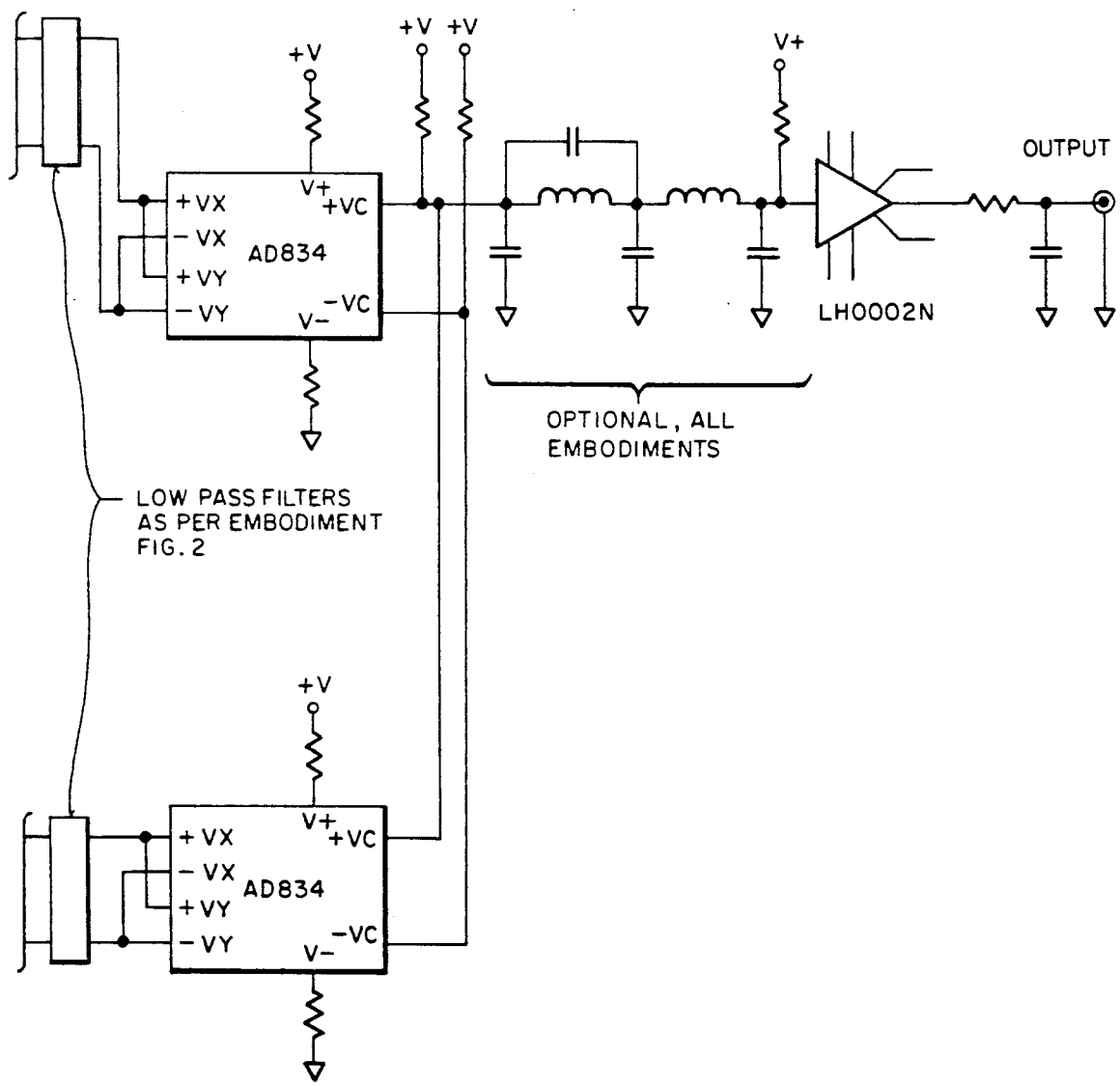

MEDIA FLAW DETECTION APPARATUS FOR A MAGNETIC DISK DRIVE WITH SQUARING AND SUMMING OF IN-PHASE AND QUADRATURE-PHASE DETECTED SIGNALS

FIELD OF THE INVENTION

The present invention relates to the field of data storage on rigid-disks that have a thin magnetic coating and rotate at a high speed. More specifically, the invention relates to methods and apparatus for detecting disk defects.

BACKGROUND OF THE INVENTION

Rigid-disk files consist of a stack of circular disks having a thin magnetic coating rotating at high speed. Data is recorded on the disk surfaces using heads or transducers mounted on actuator arms that are moved across the disk surfaces by a high-speed actuator. The actual information is recorded in circumferential tracks on the disk surfaces. Reading the recorded information back involves sensing the magnetic transitions emanating from the surface of the rigid-disk, again using the transducers.

The ability to store and read back information from the disk in the form of magnetic transitions may be impaired by the presence of disk defects. Disk defects can manifest themselves in several ways. One way is simply as noise associated with the random nature of the disk surface. Often, this noise can be easily separated from the ambient noise in the read back channel by measuring the noise from the preamplifier with the head flying over the disk and then repeating the measurement with the head unloaded from the disk.

More troublesome are flaws or defects in the disk surface that manifest themselves as missing bits or extra bits of data (i.e., single bit errors). Missing bits are reductions in the amplitude of the envelope of the signal, usually over a small number of bits (e.g., 1–4 bits), such that the amplitude falls below the channel-detector clipping level. The number of missing bits observed depends on the setting of the clipping level in the read back channel. One common technique for avoiding the problem of missing or extra bits is to perform a surface analysis of the rigid disk. This surface analysis yields an error map of the rigid-disk surface. The error map can then be referred to as a means of avoiding localized disk flaws.

During surface analysis the completed file is formatted and defects are located. These defect locations are stored in header fields at the start of the data records. The header fields are then referred to during reading/writing of information to the magnetic disk so that identical defect locations on the disk can be avoided. Obviously, all of this depends on having the capability of detecting the presence of a random disk defect or flaw. Over the years, various techniques for detecting disk defects have been developed.

In many modern disk-drive recording systems, the playback waveform at the highest analog frequency data pattern is a sinusoid waveform. According to one common approach, media defects are detected by writing this high frequency data pattern and then looking for deviations from the expected sinusoid upon playback. Since the expected signal is a sinusoid, a very narrow band tracking notch filter has been traditionally employed to effectively exclude the sinusoid and pass the deviations.

In the frequency domain these deviations correspond to phase and/or amplitude modulation sidebands about the carrier. While prior art systems have been generally capable of amplitude error detection, unfortunately they have failed to provide effective phase error detection. This means that disk flaws which generate phase rather than amplitude deviations almost always go undetected. Moreover, the error resolution of past systems was generally no better than the sector or byte level. In other words, smaller errors (having a resolution of a bit location) routinely pass undetected.

A further disadvantage characteristic of prior art approaches to media flaw detection is the relatively high expense and complexity of circuit components required. Very often, modern flaw detection circuitry demands external gain control and phase-lock-loop (PLL) circuitry which is not readily integrated into the disk drive system.

What is needed then is an effective, simple and inexpensive defect detection system that may be used to reliably identify the locations of flaws in a magnetic recording media. As will be seen, the present invention provides an improved apparatus and method for detecting flaws that is easily integrated into a disk drive system, thus enabling the system to create its own error map without the usual large capital equipment investment in the manufacturing operation. Furthermore, the invention is readily integrated into existing recording channel devices at very little incremental cost.

Alternatively, the circuit components may be packaged as a small test module to be temporarily plugged into the drive during the flaw mapping process as part of the disk drive manufacturing process.

In either embodiment, the flaw detector of the present invention is capable of detecting flaws down to the single bit level. In addition, its performance is independent of the flaw position relative to the recorded magnetic transitions. Due to this phase independence, a much more reliable flaw map can be formed in a single pass.

SUMMARY OF THE INVENTION

An apparatus for detecting media flaws in magnetic recording systems is disclosed. The invention provides the disk drive with a simple, sensitive, and integrated self-flaw mapping capability. Importantly, the detection scheme of the present invention is phase-independent, meaning that disk defects are identified independent of their location relative to the written test pattern.

In accordance with the present invention, the test pattern is written at the highest practical constant frequency, resulting in the highest defect resolution. The effect of the high write frequency is a near-sinusoidal playback signal. The detector apparatus includes a means for dividing the frequency of the recovered clock of the disk drive system by an integer N. The integer N is selected for the particular RLL modulation code employed. By way of example, for a $(1,7)$ modulation code, N equals 4 in the current embodiments. In general, N is equal to the data period divided by the data bit cell time or clock window. The output of the divider means produces in-phase and quadrature-phase signal components: One signal component of the recovered clock signal being shifted by 90°, while the phase of the other component remains unchanged.

Next, a means is included for heterodyning the in-phase and quadrature-phase signal components against the playback signal received from the read channel of the disk drive recording system. Heterodyning produces in-phase and quadrature-phase intermediate signals. These signals are squared and summed to produce an output related to the presence of a media defect. Squaring and summing is critical to the operation of the present invention, since mathematically this renders the output signal phase independent.

In certain embodiments, low pass filtering is included to remove unwanted harmonics in the in-phase and quadrature-phase signals prior to the squaring and summing operations. In alternative embodiments, low pass filtering is used to remove unwanted harmonics in the output signal. Such filtering is an aid to resolving extremely small defects. All together, the characteristics of the present invention allow the detector apparatus to do in one disk revolution what a conventional single disk, or in-drive analog test, requires multiple revolutions to do.

BRIEF DESCRIPTION OF THE DRAWINGS

The present invention is illustrated by way of example and not limitation in the figures of the accompanying drawings, in which like references indicate similar elements, and in which:

FIGS. 1A-1C illustrate various ways in which a single-bit defect may be manifested in a disk drives' read channel signal.

FIG. 2 is a block diagram of one embodiment of the present invention.

FIG. 3 is a block diagram of another embodiment of the present invention.

FIG. 4 illustrates yet another embodiment of the present invention.

FIG. 5 is a block diagram of an asynchronous implementation of the present invention.

FIG. 6 shows a detailed circuit schematic diagram of the phase-splitter circuit utilized in conjunction with several embodiments of the present invention.

FIGS. 7A-7C show a detailed circuit schematic which can be configured to represent the block diagrams illustrated in FIGS. 2, 3, 4 and 5.

DESCRIPTION OF THE PREFERRED EMBODIMENT(S)

Most commercial media testers have little difficulty in finding large media defects. However, small single bit errors are difficult to locate and frequently result in disk drive systems being shipped with defects that are not on their internal error map. The present invention provides a media flaw detector that is capable of resolving very small, single bit errors in an efficient and economical manner.

In the following description, numerous specific details are set forth, such as device types, circuit schematics, modulation codes, etc., in order to provide a thorough understanding of the present invention. However, it will be obvious to one skilled in the art, that the present may be practiced without these specific details. In other instances, well-known circuits have not been shown, or have been shown in block diagram form only, in order to avoid unnecessarily obscuring the present invention.

At maximum frequency a disk drives' read channel signal is characterized by a sinusoidal waveform. Any flaw present on the magnetic medium appears as a simultaneous amplitude and phase modulation of the sinusoidal during readback. By way of example, if a magnetic transition is stored directly on a defect or flaw, maximum amplitude modulation occurs with minimum phase error. This condition is illustrated in FIGS. 1A and 1B in which the read back sinusoid exhibits either an amplitude decrease or increase waveform at peaks 8 and 9, respectively. FIG. 1A shows a missing pulse resulting from maximum amplitude modulation with no bit shift. The situation of FIG. 1B depicts a super pulse condition in which maximum amplitude modulation results, also without bit shift.

Whenever a defect falls between two magnetic transitions, the resulting pulse is characterized as having minimum amplitude error with maximum phase error. This condition is illustrated by FIG. 1C, where a timing error occurs at transition 10 producing a large bit shift with minimum amplitude error. As is appreciated by practitioners in the art, most defects comprise a combination of phase and amplitude error components. Therefore, it is one of the objects of the present invention to provide a means for detecting media defects which is equally sensitive to amplitude and/or phase errors.

The block diagram of FIG. 2 illustrates one of the current embodiments of the flaw detector of the present invention. In accordance with the previous discussion, the analog playback input signal of FIG. 2 represents the maximum frequency sinusoid from the recording channel equalizer. Since the ability of the detector to recognize small defects varies directly with lineal recorded density, the media is written at the highest practical constant frequency. This results in the highest possible defect resolution and produces a near-sinusoidal playback signal. By this means, any small amplitude and/or phase modulation present in the analog read back input signal can be attributed to the presence of an inconsistency in the recording medium. In the frequency domain, these deviations correspond to phase and/or amplitude modulation sidebands about the carrier.

The flaw detector of FIG. 2 is distinguished as being synchronous in nature. The digital clock input signal shown in FIG. 2 is obtained from the recovered clock of the disk drive system. Synchronous detection of phase and/or amplitude modulation sidebands provides a 3dB signal-to-noise ratio advantage over asynchronous detection methods.

In the embodiment of FIG. 2 the recovered digital clock signal has a period equal to one detent, $T_w$ (also frequently referred to as a data bit cell time or clock window). The recovered clock is divided by four through an ordinary divider circuit 12 to produce in-phase and quadrature-phase local oscillator component waveforms along lines 14 and 15, respectively.

The in-phase and quadrature-phase components both have a period equal to $T_{min}$—which for the ⅔ (1,7) runlength limited (RLL) modulation code employed in the current implementation is equal to $4 \times T_w$. Therefore, the reason for dividing by four is obviously peculiar to the particular RLL modulation code employed. In more general terms, divider 12 acts to divide the frequency of the digital clock signal by N, where N is equal to the data period divided by the data bit cell time (i.e., $N = T/T_w$). For the embodiment of FIG. 2, the use of an RLL modulation code of ⅔ (1,7) dictates that circuit 12 divides by four.

Once the in-phase and quadrature-phase signal components of the recovered clock have been generated, they are multiplied with the analog read back signal. This multiplication takes place using multipliers 16 and 17, which may comprise multipliers such as Motorola part number 1495 or 1595 in the current embodiment of the flaw detector of FIG. 2. Alternatively, balanced modulators comprising either Motorola part number 1496 or 1596 may be employed to multiply the incoming signal against the local oscillator.

The in-phase and quadrature-phase local oscillator signals are heterodyned against the incoming signal utilizing modulators 16 and 17. The respective signal components are then passed through low pass filters 18 and 19 to remove unwanted harmonics. Next, the resulting signals are squared by circuits 22 and 23. These squaring circuits comprise either a simple multiplier or balanced modulator circuit. A full-wave rectifier may also be used to square the filtered signal.

The squared signals are then summed at summer 24 to remove the dependency upon phase in the output signal. Squaring and summing the in-phase and quadrature signal components is important according to the present invention since it allows the circuit of FIG. 2 to take advantage of the trigonometric relationship $$COS^2(x) + SIN^2(x) = 1$$

The output of summer 24 is finally passed through an ordinary low pass filter 25 and then to a threshold detection device to indicate the presence of a medium flaw. The output response is basically represented by a pulse in the presence of noise which can be acted upon by a threshold detector.

A fuller understanding of the present invention can be had by considering the mathematics involved in the detector of FIG. 2. To begin, assume that the analog playback signal is modeled as $$[1+m(t)] \, COS \, (\omega t + \phi)$$

where $m(t)$ is the amplitude modulating function relating to a defect, and $COS(\omega t + \phi)$ is the sinusoidal read back signal displaced in phase from $m(t)$ by an arbitrary angle, $\phi$.

In the flaw detector circuit of FIG. 2, the disk drive's recovered clock is used as the local oscillator and is represented either by $COS(\omega t)$, the in-phase clock (also referred to as ICK, in the Figures) or, when shifted by 90°, by $SIN(\omega t)$, the quadrature clock (also referred to as QCK). In the upper branch of the circuit of FIG. 3, the analog carrier signal is first multiplied by ICK, the in-phase recovered clock. The signal appearing at the output of balanced modulator 16 is then represented as $$[1+m(t)] \, COS \, (\omega t + \phi) \, COS \, (\omega t)$$

which can be rewritten as $$\frac{[1 + m(t)]}{2} [COS(\phi + 2\omega t) + COS(\phi)]$$

Similarly the output of balanced modulator 17 is represented by $$[1+m(t)] \, COS \, (\omega t + \phi) \, SIN \, (\omega t)$$

which can be rewritten as $$\frac{[1 + m(t)]}{2} [SIN(\phi + 2\omega t) + SIN(\phi)]$$

After low pass filtering, the in-phase signal is reduced to $[1+m(t)]/2 \, COS \, (\phi)$ while the low pass filter 19 in the quadrature branch of the circuit produces $$\frac{[1 + m(t)]}{2} SIN(\phi)$$

squaring each and summing yields $$\frac{[1 + m(t)]^2}{4} [SIN^2(\phi) + COS^2(\phi)] = [1 + m(t)]^2$$

For small defects, $m(t)$ is $<1$, $m(t)^2$ is $<<1$, so that the above equation is reduced to $$1 + (\tfrac{1}{2})m(t)$$

which, after A.C. coupling, yields the output $$(\tfrac{1}{2})m(t)$$

Thus, by generating in-phase and quadrature-phase components of the signal, filtering those signals to remove unwanted harmonics, and then summing the squares of each of those components, an output term is produced which is totally independent of phase.

This approach has several advantages. First, phase insensitivity improves repeatability and obviates the need for multiple test passes. According to the present invention, repeated scans of the media are not required unless off-track defect searches are desired. As discussed previously, phase insensitivity also means that the output is independent of the position of the flaw in the write pattern.

One of the important benefits of the present invention is that it uses system functions already present on the disk drive. These functions include the automatic gain control (AGC) amplifier, the equalization filter of the disk drive's read channel circuitry and the clock recovery phase-locked-loop (PLL) circuit. All of the detector circuitry of FIG. 2 is easily integrated into the drive unit itself, due to its relative simplicity and low cost. Moreover, because of its phase insensitivity, the detector of the present invention is capable of resolving defects down to single-bit level locations without multiple passes.

Note that in the circuit of FIG. 2, low pass filters 18 and 19 ideally should have a cut-off frequency of $2\omega$ to allow a maximum pass band for $m(t)$. This completely removes unwanted terms above $2\omega$. In a practical filter, however, cut-off occurs at a frequency lower than $2\omega$. Currently, the cut-off is placed as high as possible while providing sufficient attenuation of signals at $2\omega$ and above. Since it is desirable to preserve the fidelity of $m(t)$, low pass sections with constant or equal-ripple delay are employed. For modest component counts, these filters have soft roll-off characteristics. Moreover, a three-pole filter with a cut-off frequency at $\omega$ has been proven to adequately resolve flaws one bit in length while suppressing higher order terms.

With reference now to FIG. 3, an alternative embodiment of the present invention is shown. As before, the analog readback signal appearing at node 26 is input into balanced modulators 27 and 29. The recovered clock signal of the drive again acts as a local oscillator which is divided by four via divider unit 28 to generate in-phase and quadrature-phase components along lines 32 and 31, respectively. Balanced modulators 27 and 29 multiply the analog input signal with the in-phase and phase shifted digital clock to produce signal components which are subsequently squared by squaring circuits 34 and 35. The squared terms are once again summed by summer 36 and then passed through low pass filter 37 to produce the phase independent detector output. Low pass filter 37 at the output of the summing node eliminates unwanted frequency components at higher frequencies.

As is clearly seen, each of the circuit elements of FIG. 3 are virtually identical to the corresponding elements from the circuit of FIG. 2. The essential difference between the embodiment of FIG. 3 and the embodiment of FIG. 2 is that low pass filtering is performed after the squared terms have been summed, rather than before. Thus, the embodiment of FIG. 3 removes the two low pass filters following the multipliers 16 and 17 of FIG. 2.

As was the case in the detector embodiment of FIG. 2, the detector of FIG. 3 also includes upper and lower branches which multiply the playback signal by in-phase clock (ICK) and quadrature-phase clock (QCK) signals. The output of balanced modulator 27 is represented mathematically as $$\frac{[1 + m(t)]}{2} [COS\phi + COS(2\omega t + \phi)]$$

while the output of modulator 29 is written as $$\frac{[1 + m(t)]}{2} [SIN(\phi) + SIN(2\omega t + \phi)]$$

Squaring both signals yields $$\frac{[1 + m(t)]^2}{4} [COS^2\phi + 2COS(\phi)COS(2\omega t + \phi) + COS^2(2\omega t + \phi)]$$

$$\frac{[1 + m(t)]^2}{4} [SIN^2\phi + 2SIN(\phi)SIN(2\omega t + \phi) + SIN^2(2\omega t + \phi)]$$

Summing each signal term yields $$\frac{[1 + m(t)]^2}{2} [1 + SIN(\phi)SIN(2\omega t + \phi) + COS\phi COS(2\omega t + \phi)]$$

After low pass filtering, the above equation becomes $$\frac{[1 + m(t)]^2}{2}$$

Once again for small defects $m(t) < 1$, $m(t)^2 << 1$, and the resulting detector output becomes $1 + m(t)$ which after AC coupling is simply the output $m(t)$. Thus, the embodiment of FIG. 3 is twice as sensitive as the embodiment of FIG. 1, but requires only one half as many external components.

Referring now to FIG. 4, yet another embodiment of the detector of the present invention is shown. The detector of FIG. 4 eliminates all low pass filter elements at the expense of increased circuit complexity. In the embodiment of FIG. 4, the analog and digital signals are input to phase splitters 40 and 41, respectively. Phase splitters 40 and 41 each comprise parallel cross-coupled RC networks that generate in-phase and quadrature-phase (i.e., phase shifted by 90°) signal components. A detailed circuit schematic of the phase splitter currently employed is shown in FIG. 6.

Thus, node 44 provides an in-phase component of the analog input while node 43 provides the analog input signal shifted by 90°. Similarly, node 46 provides the in-phase digital clock oscillator signal while the quadrature component of the local oscillator appears at node 45. Each of these respective signals are input to multipliers 47-50.

The signal components appearing at each of the outputs of multipliers 47-50 are, respectively $$\frac{[1 + m(t)]}{2} [-SIN(\phi) + SIN(2\omega t + \phi)]$$

$$\frac{[1 + m(t)]}{2} [COS(\phi) + COS(2\omega t + \phi)]$$

$$\frac{[1 + m(t)]}{2} [SIN(\phi) + SIN(2\omega t + \phi)]$$

$$\frac{[1 + m(t)]}{2} [COS(\phi) - COS(2\omega t + \phi)]$$

Adding the outputs of multiplier 47 and multiplier 49 at summer 52 yields $$[1 + m(t)] COS (\phi)$$

Subtracting the output of multiplier 48 from the output of multiplier 50 at summer 53 results in $$[1 + m(t)] SIN (\phi)$$

Squaring and summing the results (via multipliers 57, 58 and summer 60) produces $$[1 + m(t)]^2 = 1 + 2m(t) + m^2(t)$$

Applying the same assumptions as before the output may simply be written as $2m(t)$.

Another, more simplified version of the present invention is illustrated in FIG. 5. First of all, note that the detector of FIG. 5 is asynchronous in nature. This is in contrast to the synchronous detectors of FIGS. 2, 3 and 4. Synchronous detection offers a theoretical 3dB signal/noise ratio (SNR) improvement over asynchronous detection at small input SNR. For most modern disk drive systems, the input signal-to-noise power ratio is relatively large. Thus, the advantage of the embodiment of FIG. 5 is markedly reduced complexity.

In the upper branch of the detector of FIG. 5, the analog read back signal is squared by squaring circuit 66 and passed to summer 69. At the same time, in the lower branch, the analog read back signal is shifted 90° in phase by all-pass phase differencing network 65, and squared by circuit 67. Both outputs are summed at summer 69 to produce $$[1-m(t)]^2[\cos^2(\omega t+\phi)-\sin^2(\omega t+\phi)] = [1+m(t)]^2$$

Once again, for small defects and after AC coupling the result is the desired output, 2m(t). Note that even in this asynchronous version, the detected signal is not a function of the position, $\phi$, of the defect relative to the recorded signal. That is, the detector output is independent of phase.

FIG. 7 shows a detailed circuit schematic diagram which may be configured to represent each of the block diagrams of FIGS. 2, 3, 4 and 5. It should be understood that the circuit of FIG. 7 represents only one possible way of implementing the diagrams of FIGS. 2-5. Ordinary practitioners in the art will appreciate the detailed circuit operation of the schematic of FIG. 7.

It should be understood that the foregoing disclosure relates only to current embodiments of the present invention and that modifications may be made without departing from the nature and scope of the present invention. It should also be understood that the terms and expressions which have been employed here are used as terms of description and not of limitation, and there is no intention in the use of such terms and expressions of excluding equivalents of the features shown and described, or portions thereof—it being recognized that various modifications are possible within the scope of the invention claimed.

What is claimed is:

1. In a disk drive system for recording information on a magnetic disk medium which includes a read channel and a means for generating a recovered clock signal, an apparatus for detecting defects in said medium comprising:
    divider means for dividing the frequency of said recovered clock of said system by N, where N is an integer greater than one, to produce in-phase and quadrature-phase oscillator components;
    means for heterodyning said in-phase and quadrature-phase oscillator components against the playback input signal received from said read channel of said system to produce in-phase and quadrature-phase signals;
    circuit means for squaring and summing said in-phase and quadrature-phase signals to produce an output signal having an amplitude modulated in relation to the presence of a defect.

2. The apparatus of claim 1 further comprising low pass filter means coupled to said heterodyning means for removing unwanted harmonics in said in-phase and quadrature-phase signals.

3. The apparatus of claim 2 further comprising an additional low pass filter means coupled to receive said output signal from said circuit means for removing unwanted harmonics in said output signal.

4. The apparatus of claim 3 wherein the amplitude of said output signal is modulated independent of the position of the defects on said medium relative to the phase of said recovered clock signal.

5. The apparatus of claim 1 wherein said heterodyning means comprises a pair of balanced modulators.

6. The apparatus of claim 5 wherein said divider means, said balanced modulator and said circuit means comprises an integrated circuit having matched devices such that unwanted frequency components resulting from circuit imbalances are substantially eliminated from said output signal.

7. The apparatus of claim 6 wherein said low pass filter means attenuates signals at frequencies of $2\omega$ or greater to permit resolution of defects which are one bit in length.

8. The apparatus of claim 7 wherein the period of said in-phase and quadrature-phase oscillator components is equal to $T_{MIN}$.

9. The apparatus of claim 8 wherein N=4 for a modulation code of ⅔ (1,7).

10. An apparatus fo synchronously detecting defects in a magnetic disk drive medium comprising:
    means for generating read back and recovered clock signals from a periodic waveform recorded on said medium;
    phase splitter means for splitting said read back and recovered clock signals into in-phase and quadrature-phase components;
    means for modulating said in-phase and quadrature-phase components of said read back signal with said quadrature-phase and in-phase components of said recovered clock signal, respectively, to produce first and second signals, and also for modulating said in-phase and quadrature-phase components of said read back signal with said in-phase and quadrature-phase components of said recovered clock signal, respectively, to produce third and fourth signals;
    circuit means for summing said first and second signals and squaring the result to produce a first intermediate signal, said circuit means also for subtracting said third signal from said fourth signal and squaring that result to produce a second intermediate signal, and further for summing said first and second intermediate signals to generate an output signal whose amplitude is modulated in relation to a defect location on said medium.

11. The apparatus of claim 10 further comprising low pass filter means coupled to receive said output signal of said circut means for filtering unwanted harmonics in said output signal.

12. The apparatus of claim 11 wherein the amplitude of said output signal is modulated independent of the position of the defect on said medium relative to the phase of said recovered clock signal.

13. The apparatus of claim 10 wherein said phase splitter means, said modulator means and said circuit means comprise an integrated circuit having matched devices such that unwanted frequency components resulting from circuit imbalances are substantially eliminated in said output signal.

14. The apparatus of claim 11 wherein said low pass filter means attenuates signals at frequencies of $2\omega$ or greater, thereby permitting resolution of defects which are one bit in length.

15. The apparatus of claim 14 wherein the period of said in-phase and quadrature-phase components of said read back signal and said recovery clock signal are equal to $T_{MIN}$.

16. An apparatus for asynchronously detecting defects in a magnetic disk-drive medium comprising:
    means for generating an analog read back signal from a periodic waveform recorded on said medium;
    phase splitter means for splitting said analog read back signal into in-phase and quadrature-phase components;
    circuit means for squaring said in-phase and quadrature-phase components and summing the result to generate an output signal whose amplitude is modulated in relation to a defect location on said medium.

17. The apparatus of claim 16 further comprising low pass filter means coupled to said circuit means for removing unwanted harmonics in said output signal.

18. The method of detecting a flaw in a magnetic disk-drive medium comprising the steps of:
writing a data pattern to said medium;
reading said data pattern from said medium thereby producing playback and recovered clock waveforms;
generating in-phase and quadrature-phase components of said recovered clock waveform;
modulating said playback waveform with said in-phase and quadrature-phase components to produce in-phase and quadrature-phase signals;
squaring said in-phase and quadrature-phase signals;
summing the squared in-phase and quadrature-phase signals such that the summed output signal has an amplitude which is modulated in relation to the location of said flaw on said medium, said amplitude being modulated independent of the position of said flaw relative to the written magnetic transitions of said data pattern.

19. The method according to claim 18 wherein said data pattern is written at the highest possible constant frequency such that said playback waveform comprises a sinusoid with small amplitude and/or phase modulation due to the presence of a defect in said medium.

20. The method according to claim 19 further comprising the step of low pass filtering said output signal to remove unwanted harmonics.

21. The method according to claim 19 further comprising the step of low pass filtering said in-phase and quadrature-phase signals prior to said squaring step to remove unwanted harmonics.

* * * * *